(12) United States Patent
Lei et al.

(10) Patent No.: US 11,901,327 B2
(45) Date of Patent: Feb. 13, 2024

(54) WIRE BONDING FOR SEMICONDUCTOR DEVICES

(71) Applicant: WESTERN DIGITAL TECHNOLOGIES, INC., San Jose, CA (US)

(72) Inventors: Yang Lei, Shanghai (CN); Xiaofeng Di, Shanghai (CN); Yuyun Lou, Shanghai (CN); Zhonghua Qian, Shanghai (CN); Junrong Yan, Shanghai (CN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 83 days.

(21) Appl. No.: 17/186,715

(22) Filed: Feb. 26, 2021

(65) Prior Publication Data
US 2022/0052014 A1 Feb. 17, 2022

Related U.S. Application Data

(60) Provisional application No. 63/065,191, filed on Aug. 13, 2020.

(51) Int. Cl.
*H01L 23/00* (2006.01)

(52) U.S. Cl.
CPC .............. *H01L 24/48* (2013.01); *H01L 24/04* (2013.01); *H01L 24/78* (2013.01); *H01L 24/85* (2013.01); *H01L 2224/04042* (2013.01); *H01L 2224/4805* (2013.01); *H01L 2224/4807* (2013.01); *H01L 2224/4845* (2013.01); *H01L 2224/48451* (2013.01); *H01L 2224/48453* (2013.01);

(Continued)

(58) Field of Classification Search
CPC ....... H01L 24/47–49; H01L 2224/4805; H01L 2224/4807; H01L 2224/48451; H01L 2224/48453

See application file for complete search history.

(56) References Cited

U.S. PATENT DOCUMENTS

| | | | | |
|---|---|---|---|---|
| 5,905,308 A | * | 5/1999 | Efland | ..................... H01L 24/03 257/784 |
| 5,938,105 A | | 8/1999 | Singh | |

(Continued)

FOREIGN PATENT DOCUMENTS

| | | | | | |
|---|---|---|---|---|---|
| JP | H1056030 A | * | 2/1998 | ............. | H01L 24/06 |
| JP | 2009076767 A | * | 4/2009 | ............. | H01L 24/48 |
| JP | 2012124426 A | * | 6/2012 | ............. | H01L 24/48 |

OTHER PUBLICATIONS

Zhong, Z.W. "Fine and ultra-fine pitch wire bonding: challenges and solutions." Microelectronics International, vol. 26, No. 2, 2009, 10-18.

*Primary Examiner* — David A Zarneke
(74) *Attorney, Agent, or Firm* — Morgan, Lewis & Bockius LLP

(57) ABSTRACT

A semiconductor device includes an integrated circuit die having bond pads and a bond wires. The bond wires are connected to respective ones of the bond pads by a ball bond. An area of contact between the ball bond and the bond pad has a predetermined shape that is non-circular and includes at least one axis of symmetry. A ratio of the ball bond length to the ball bond width may be equal to a ratio of the bond pad length to the bond pad width.

11 Claims, 14 Drawing Sheets

(52) U.S. Cl.
CPC ............... *H01L 2224/48463* (2013.01); *H01L 2224/48482* (2013.01); *H01L 2224/7895* (2013.01); *H01L 2224/8503* (2013.01); *H01L 2924/381* (2013.01)

(56) References Cited

U.S. PATENT DOCUMENTS

| | | | |
|---|---|---|---|
| 6,065,667 | A | 5/2000 | Singh |
| 6,213,378 | B1 | 4/2001 | Singh |
| 6,239,703 | B1 * | 5/2001 | Friedman ........... G08B 13/2431 340/568.1 |
| 9,209,147 | B1 | 12/2015 | Foong et al. |

\* cited by examiner

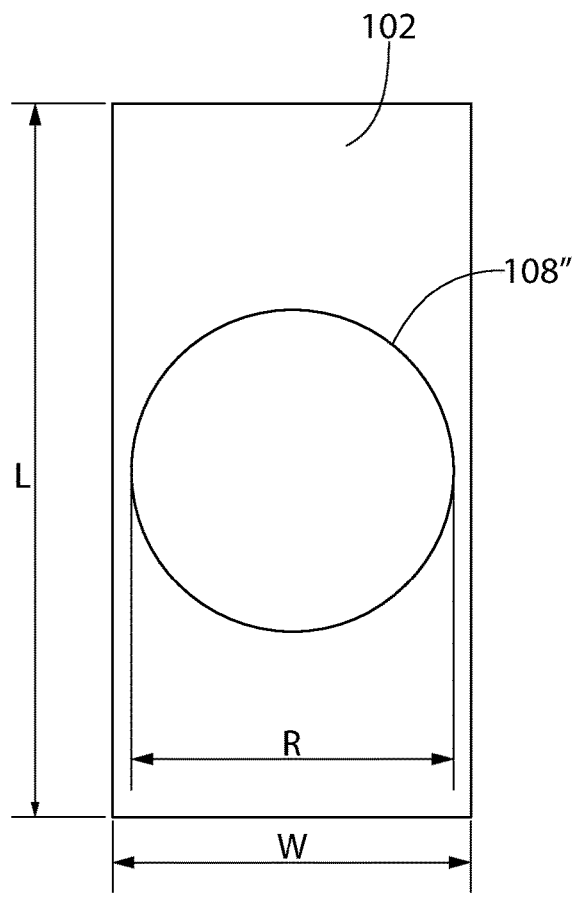
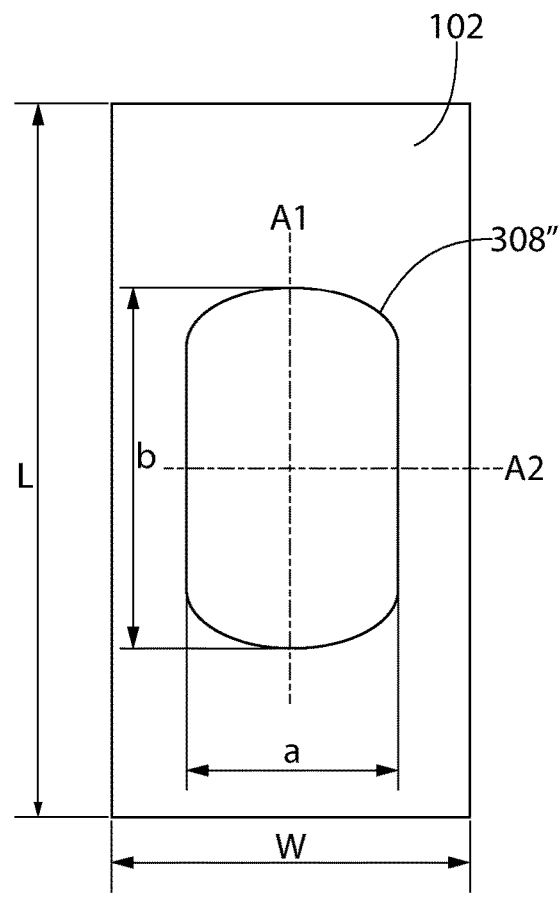
FIG. 6
(PRIOR ART)
FIG. 7

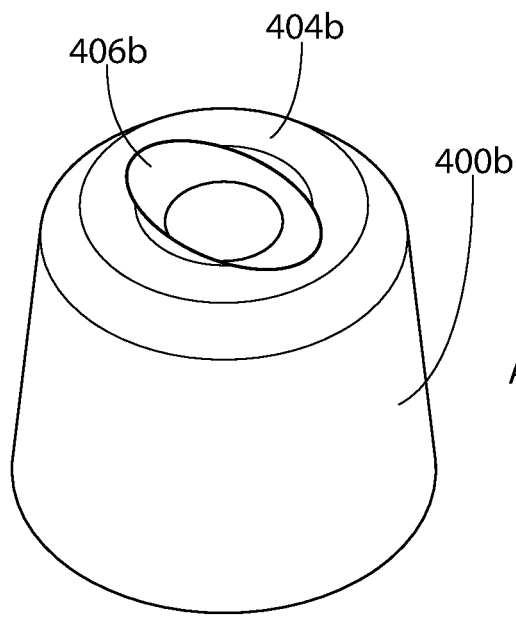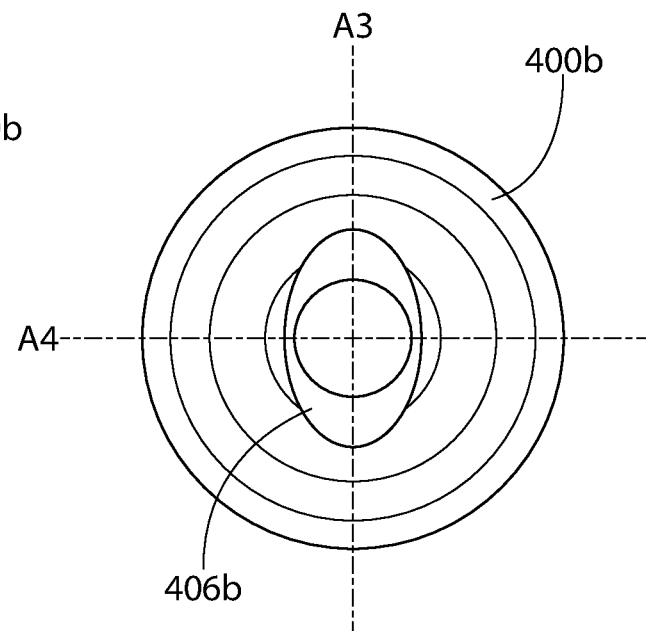
FIG. 13A   FIG. 13B
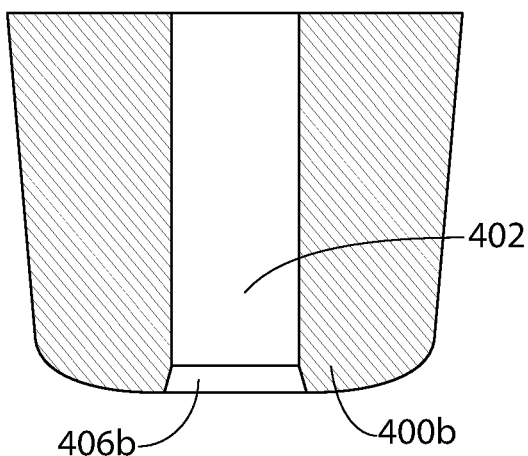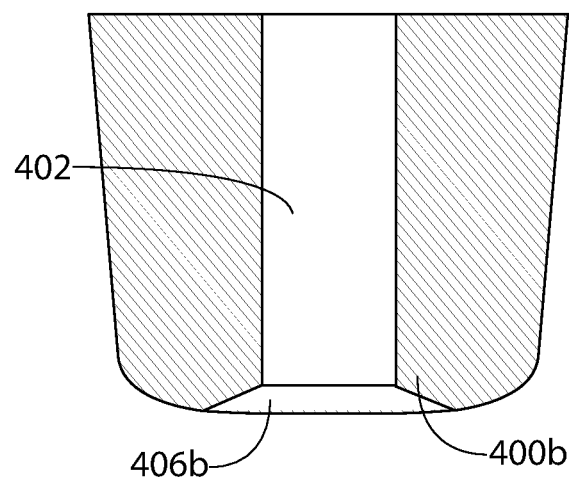
FIG. 13C   FIG. 13D

WIRE BONDING FOR SEMICONDUCTOR DEVICES

CROSS-REFERENCE TO RELATED APPLICATION(S)

This application claims priority to and the benefit of U.S. Provisional Application No. 63/065,191, filed Aug. 13, 2020, which is incorporated herein by reference in its entirety.

BACKGROUND

The present disclosure relates to wire bonding for semiconductor devices, particularly fine pitch and ultra-fine pitch semiconductor devices. In some embodiments, the present disclosure relates to methods for wire bonding. In further embodiments, the present disclosure relates to capillaries for use in wire bonding.

Wire bonding is a process of forming interconnections between a semiconductor device (e.g., an integrated circuit (IC) die) and its packaging and/or other electronic components. According to this process, a metal wire (e.g., gold, copper, aluminum, or alloy thereof) is welded to the bond pad of an IC die or other semiconductor device typically through a combination of heat and pressure. A conventional wire bonding process, sometimes referred to as ball bonding, generally involves feeding the metal wire through a hollow capillary and melting the end of the wire that extends through the tip of the capillary. Because of surface tension, the molten metal forms a ball at the end of the wire. The tip of the capillary then presses and flattens the ball against the surface of the bond pad, and heat and/or ultrasonic energy welds the flattened ball to the bond pad to form a ball bond. The ball bond may have a generally circular footprint on the bond pad with a diameter, for example, of about 35 µm.

As the capacity of semiconductor devices has continued to increase, there has been a corresponding increase in the number of input/output connections needed for certain semiconductor devices. In order to accommodate the increase in connections without increasing the package size, some semiconductor devices utilize smaller bond pad dimensions to permit a greater number of bond pads. Furthermore, the center-to-center or first edge-to-first edge distance between adjacent bond pads (bond pad pitch) may also be reduced to allow for a denser arrangement of the bond pads. For example, some existing IC dies include bond pads with dimensions of about 100 µm×about 50 µm or smaller and have a bond pad pitch of less than 100 µm. As used herein, the term "fine pitch" refers to a bond pad pitch of up to 100 µm, and the term "ultra-fine pitch" refers to a bond pad pitch of up to 60 µm.

As the dimensions of the bond pad approach the diameter of the ball bond, and the spacing between bond pads decreases, the wire bonding process becomes more challenging because of greater chances of defects and the need for tighter tolerances. For instance, a ball bond that is not properly centered or positioned on the bond pad may extend past the edge of the bond pad and contact an adjacent bond pad, resulting in a short circuit. A similar problem may also occur if the ball bond is irregularly shaped and extends beyond the edge of the bond pad (e.g., as shown in FIG. 5). One approach to overcoming this difficulty is to produce smaller ball bonds, for example, by using finer wires in the wire bonding process and/or by using capillaries with smaller diameters. However, the smaller ball bonds have comparatively less surface contact with the bond pads, potentially resulting in weaker bonding strength as well as reduced current flow. It would therefore be advantageous to have ball bonds that can be utilized with fine pitch or ultra-fine pitch semiconductor devices while maintaining adequate surface contact with the underlying bond pads.

SUMMARY

The present disclosure, according to some embodiments, provides a semiconductor device including an integrated circuit die having a plurality of bond pads and a plurality of bond wires, each of the plurality of bond wires being physically connected to a respective one of the plurality of bond pads by a ball bond. In some embodiments, an area of contact between each ball bond and the respective bond pad has a shape that is non-circular and includes a first axis of symmetry. In some embodiments, the shape of the area of contact includes a second axis of symmetry, the second axis of symmetry being perpendicular to the first axis of symmetry. In some embodiments, the shape of the area of contact includes no more than two axes of symmetry. The shape of the area of contact may be, for example, a stadium shape, an oval, an ellipse, a rectangle, a rounded rectangle, or a rhombus.

In some embodiments, each ball bond includes a ball bond width and a ball bond length, and wherein a ratio of the ball bond length to the ball bond width is greater than 1.1. In some embodiments, the ratio of the ball bond length to the ball bond width is equal to or greater than 2.0. In some embodiments, the ball bond length is the largest dimension of the shape of the area of contact along the first axis of symmetry. In some embodiments, each of the bond pads includes a bond pad width and a bond pad length, and the ratio of the ball bond length to the ball bond width is equal to a ratio of the bond pad length to the bond pad width±10%. In some embodiments, the ratio of the ball bond length to the ball bond width is equal to the ratio of the bond pad length to the bond pad width±5%. In some embodiments, the ratio of the ball bond length to the ball bond width is equal to the ratio of the bond pad length to the bond pad width. In some embodiments, the area of contact is greater than an area of a circle with a diameter equal to the ball bond width.

In further embodiments, the present disclosure provides a method for forming a ball bond. In some embodiments, the method includes providing a capillary having a distal opening having a non-circular shape and positioning a bond wire through a bore of a capillary such that an end of the bond wire extends past a distal opening of the capillary. In some embodiments, the method further includes forming a ball at the end of the bond wire, contacting the ball to a surface of a bond pad of a semiconductor device, molding the ball with the distal opening of the capillary to form the ball into a predetermined shape, and welding the ball to the surface of the bond pad to form a ball bond. The predetermined shape includes a footprint that is, in some embodiments, non-circular in shape and includes at least a first axis of symmetry. In some embodiments, an area of contact between the ball bond and the bond pad has a shape that is non-circular and includes a first axis of symmetry and a second axis of symmetry that is perpendicular to the first axis of symmetry. In some embodiments, the shape of the area of contact may be, for example, a stadium shape, an oval, an ellipse, a rectangle, a rounded rectangle, and a rhombus. In some embodiments, the ball bond includes a ball bond width and a ball bond length, and a ratio of the ball bond length to the ball bond width is greater than 1.1. In some embodiments, the bond pad includes a bond pad width and a bond pad length, and the ratio of the ball bond length to the ball bond width is equal to a ratio of the bond pad length to the bond pad width±10%.

In some embodiments, the present disclosure provides a capillary for forming a ball bond. In some such embodiments, the capillary includes a body having a bore configured to receive a bond wire, and a distal opening at a tip of the body connected to the bore. In some embodiments, the distal opening has a non-circular shape. The non-circular shape of the distal opening may be, for example, a stadium shape, an oval, an ellipse, a rectangle, a rounded rectangle, or a rhombus. In some embodiments, the non-circular shape includes at least one axis of symmetry. In some embodiments, the non-circular shape includes at most two axes of symmetry.

In some embodiments, the present disclosure provides a system for forming a ball bond that includes a bond wire sized and configured to form a connection to a semiconductor device, and a capillary having a bore configured to receive the bond wire and a distal opening at a tip of the capillary having a non-circular shape. The non-circular shape of the distal opening may be, for example, a stadium shape, an oval, an ellipse, a rectangle, a rounded rectangle, or a rhombus.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be understood that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

FIG. 6 is a diagram illustrating the footprint of a conventional ball bond on a bond pad;

FIG. 7 is a diagram illustrating the footprint of a stadium-shaped ball bond on a bond pad according to an embodiment of the present disclosure;

FIGS. 13A-13D show views of a capillary that is configured to produce a ball bond having an oval shape according to an embodiment of the present disclosure;

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
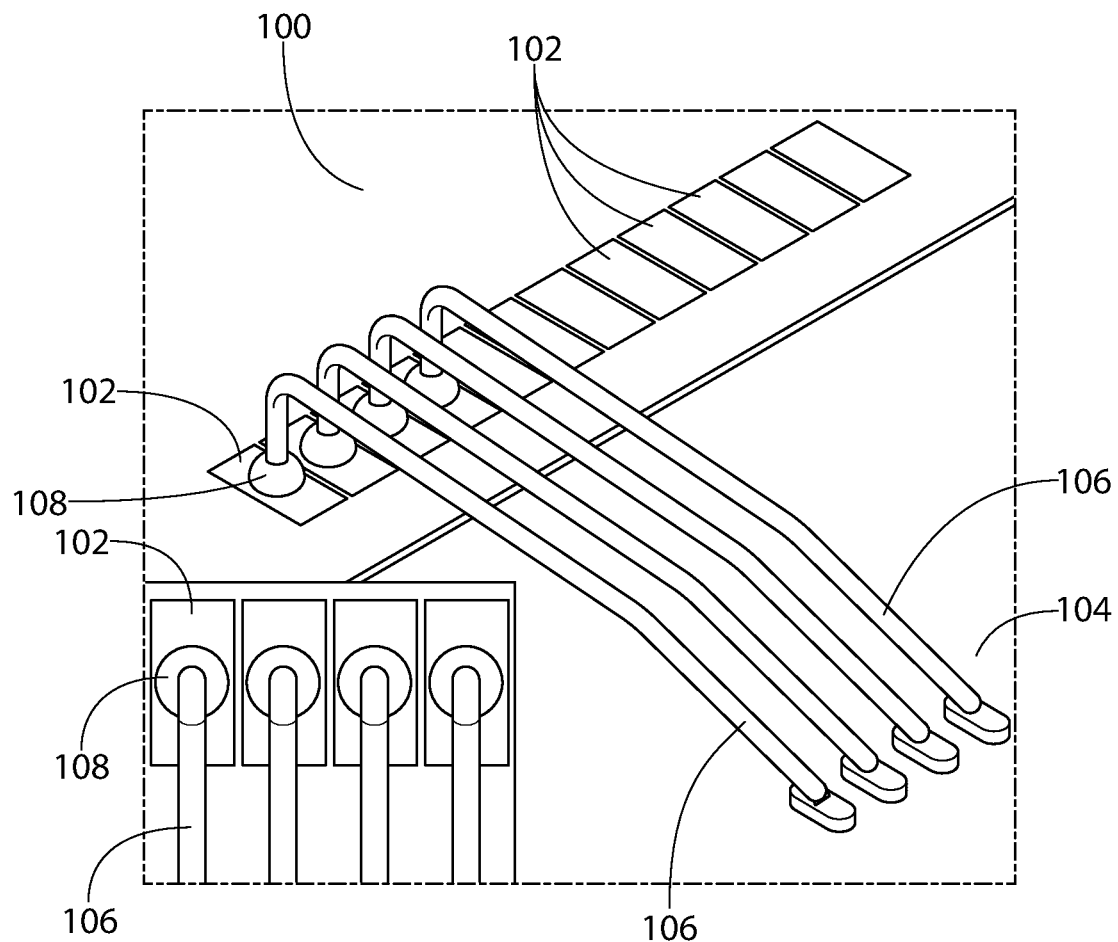
FIG. 1 is an illustration showing a portion of a semiconductor device with a plurality of bond pads and wires connected thereto with conventional ball bonds.

FIG. 1 is an illustration showing a partial perspective view of a conventional semiconductor device 100 that may be, for example, an integrated circuit (IC) die. Semiconductor device 100 includes a plurality of bond pads 102 that are configured to be connected to a packaging component 104, such as a lead frame or other physical structure for conducting electrical signals to/from semiconductor device 100. As shown in the illustration, bond pads 102 are connected to packaging component 104 via a series of bond wires 106 that extend between bond pads 102 and packaging component 104. Bond pads 102 and bond wires 106 are formed from electrically conductive materials, usually a metal or metal alloy, for example, gold, copper, silver, aluminum, or alloys thereof. Bond pads 102 and bond wires 106 may be made from the same material or different materials. Each bond wire 106 may be connected to a separate bond pad 102. Typically each bond pad 102 will have a separate bond wire 106 connected thereto, but for clarity and ease of illustration FIG. 1 does not show every bond wire 106.

Figure 2A:
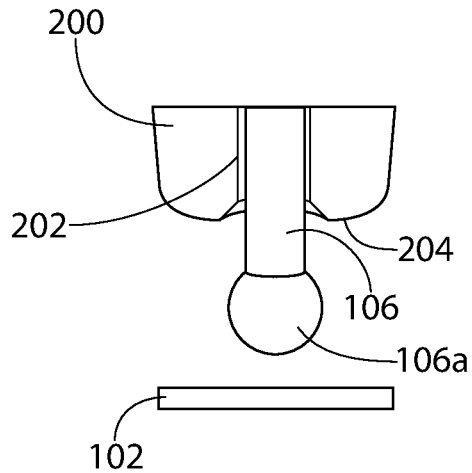
FIGS. 2A-2D illustrate steps of a conventional wire bonding process used to form a ball bond on a bond pad.
Figure 2B:
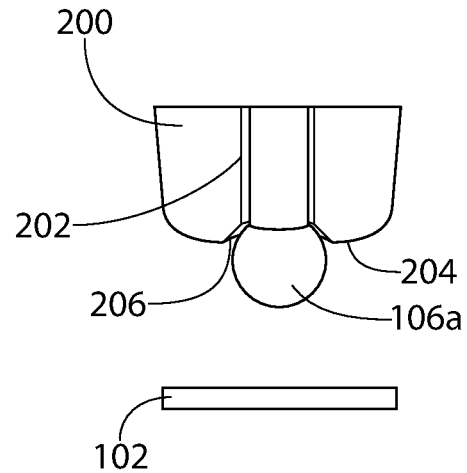
Figure 2C:
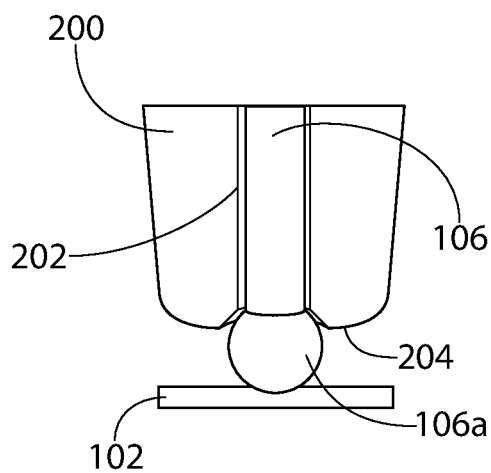
Figure 2D:
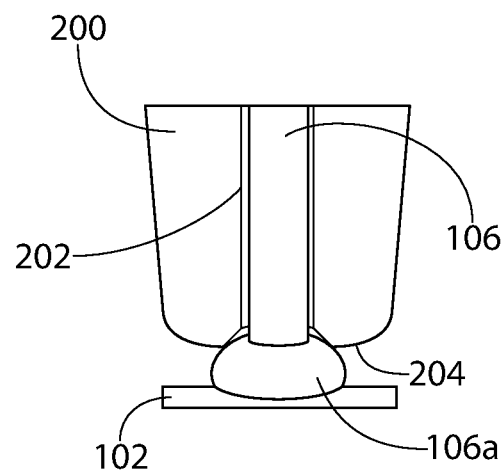
Figure 3:
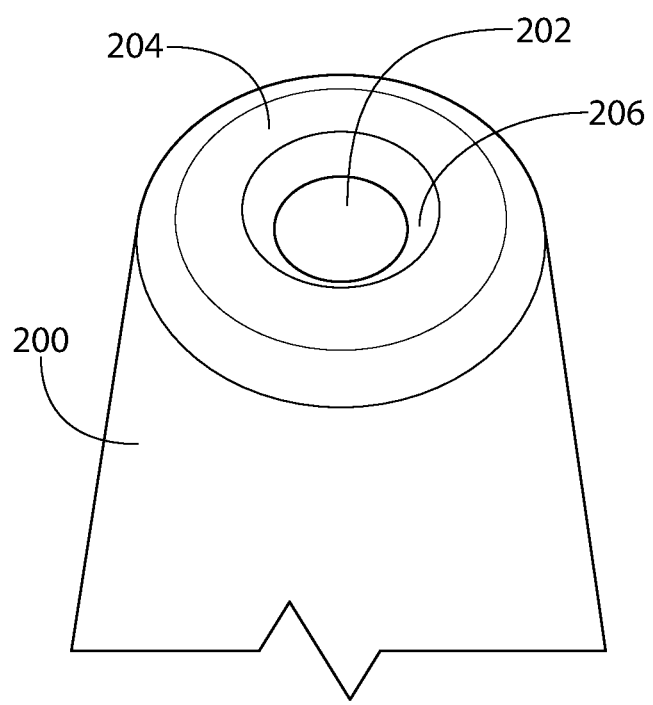
FIG. 3 is an illustration showing a tip of a conventional capillary having a circular opening.

Each bond wire 106 may be physically connected to its respective bond pad 102 via a ball bond 108 that is secured (e.g., welded) to the contact surface of bond pad 102 and formed from a wire bonding process, particularly a ball bonding process. FIGS. 2A-2D provide cutaway views illustrating certain steps of a conventional ball bonding process. In FIG. 2A, bond wire 106 has been fed through the bore 202 of a hollow capillary 200 and is positioned above a bond pad 102. An end of bond wire 106 that extends past the tip 204 of capillary 200 is melted, for example, by a high-voltage electric charge or an electronic flame off (EFO) mechanism. Due to surface tension, the melted end of bond wire 106 beads up into a ball 106a, sometimes referred to as a "free air ball" or FAB. Ball 106a may have a diameter greater than the diameter of bond wire 106 or bore 202. In FIG. 2B, ball 106a is drawn toward tip 204 of capillary 200 (e.g., by an air tensioner) and is positioned within a chamfered opening 206 at tip 204 of capillary 200. In FIG. 2C, capillary 200 and ball 106a are moved together toward bond pad 102 such that ball 106a makes physical contact with the surface of bond pad 102. For example, capillary 200 and ball 106a may be moved at a constant speed of about 0.6 mils/ms (0.01524 mm/ms). In FIG. 2D, tip 204 of capillary 200 continues to press ball 106a against the surface of bond pad 102, causing ball 106a to flatten against bond pad 102 and expand radially and/or laterally. Ball 106a may then be welded to bond pad 102 using heat and/or ultrasonic energy to form ball bond 108. FIG. 3 provides a perspective view showing tip 204 of a conventional capillary 200 that may be used in the ball bonding process discussed in connection with FIGS. 2A-2D. As illustrated, conventional capillary 200 includes a circular chamfered opening 206 at tip 204. Tip 204 of capillary 200 may be considered a solid of revolution with an axis of revolution extending through bore 202.

Figure 4C:
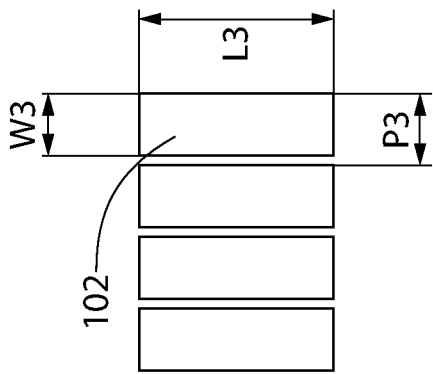
FIGS. 4A-4C are diagrams illustrating the relative dimensions and bond pad pitches of example semiconductor devices.
Figure 4B:
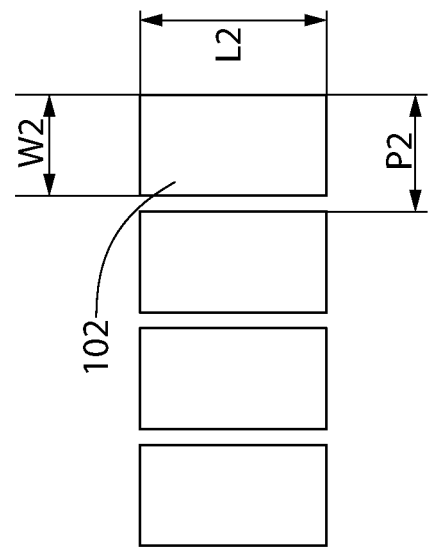
Figure 4A:
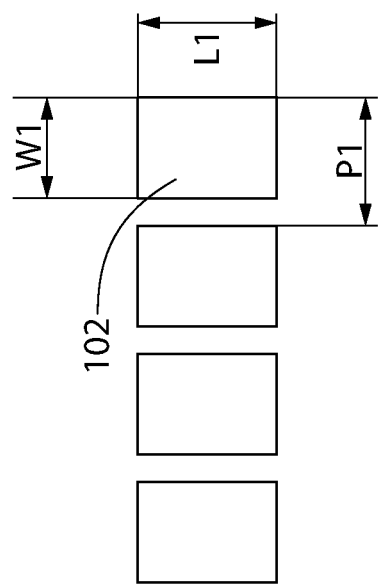

Referring now to FIGS. 4A-4C, diagrams illustrating the relative bond pad dimensions and bond pad pitches of three example semiconductor devices are shown. FIG. 4A shows the bond pad arrangement for a first IC die that includes rectangular bond pads having a length L1 of about 59.4 µm, a width W1 of about 48.6 µm, and a bond pad pitch P1 of about 60.3 µm. Bond pad pitch may be measured as the center-to-center or first edge-to-first edge distance between two adjacent bond pads. FIG. 4B shows the bond pad arrangement for a second IC die that includes narrower rectangular bond pads having a length L2 of about 80 µm, a width W2 of about 44 µm, and a smaller bond pad pitch P2 of about 50 µm. FIG. 4C shows the bond pad arrangement for a third IC die that includes even narrower bond pads having a length L3 of about 80 µm, a width W3 of about 40 µm and an even smaller bond pad pitch P3 of about 45 µm.

Figure 5:
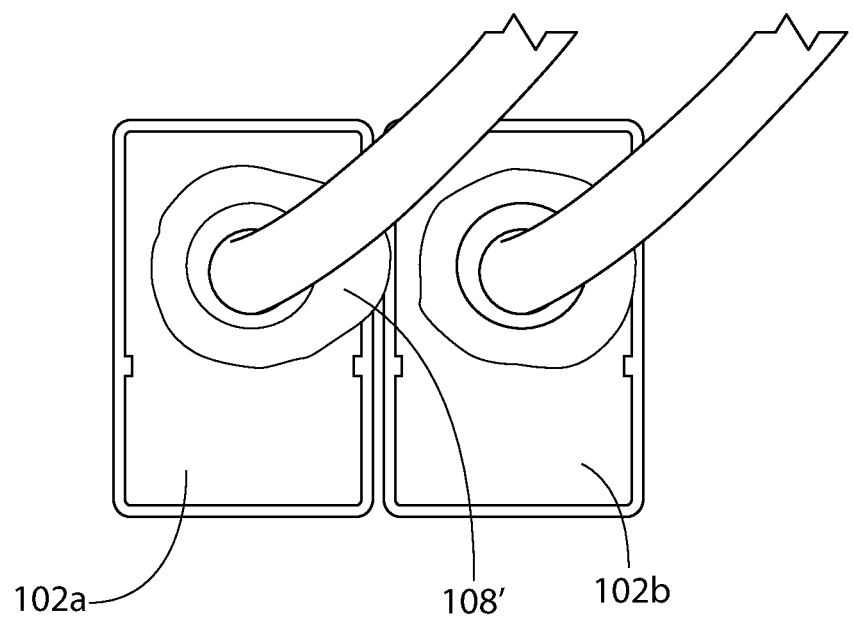
FIG. 5 is an illustration showing a defective conventional ball bond extending past the edge of a bond pad.

As discussed, an increasing challenge for conventional ball bonding is the shrinking of bond pad dimensions and bond pad pitch in order to increase bond pad density in semiconductor devices. As the dimensions of the bond pad approaches the diameter of the ball bond (e.g., ball bond 108 of FIG. 1) there is a need for tighter tolerances. A conventional ball bond (e.g., ball bond 108) may have a diameter between about 30 µm and about 40 µm, for example, about 34 µm to about 38 µm. Placement of such a conventional ball bond on a narrow 40 µm-wide bond pad (e.g., as shown in FIG. 4C) may therefore have a clearance of less than 5 µm between a lateral edge of the bond pad and a perfectly centered ball bond. FIG. 6 illustrates the circular footprint 108" of an idealized conventional ball bond having a diameter of about 34 µm over a bond pad 102 with a width W of about 40 µm and a length L of about 80 µm. As used herein, footprint refers to the area of a ball bond that is configured to contact a bond pad. A conventional ball bond that is not properly centered or positioned on the bond pad may extend past the edge of the bond pad and contact an adjacent bond pad, potentially causing a short circuit. A similar problem may also occur if the ball bond is misshaped, for example, during the flattening step shown in FIG. 2D. FIG. 5 is an illustration showing an example prior art ball bond 108' that is misshaped and extends beyond the edge of first bond pad 102a and contacts a second bond pad 102b.

One approach to addressing these difficulties is to reduce the size of the conventional ball bonds in order to decrease their diameters. This reduction can be achieved, for example, by using finer bond wires, using capillaries with smaller openings, or manipulating various parameters during the ball bonding process. However, simply reducing the diameter of the ball bond results in a smaller surface area in contact with the bond pad, and, in turn, decreases the bond strength. Furthermore, a smaller ball bond may also limit the amount of current flow permitted through the connected bond wire.

The present disclosure, according to some embodiments, provides ball bonds that can overcome one or more of these problems. In some embodiments, the present disclosure provides ball bonds which have a non-circular footprint shape. In some embodiments, a ball bond according to the present disclosure includes a footprint shape which is longer in a first dimension (e.g., length) and shorter in a second dimension (e.g., width). In some embodiments, a ball bond according to the present disclosure includes a footprint shape that has reflectional symmetry (line symmetry) about at least one axis of symmetry. In some embodiments, a ball bond according to the present disclosure includes a footprint shape that has reflectional symmetry about only one axis of symmetry. In some embodiments, a ball bond according to the present disclosure includes a footprint shape that has reflectional symmetry about at least two axes of symmetry. In some embodiments, a ball bond according to the present disclosure includes a footprint shape that has reflectional symmetry about only two axes of symmetry or at most two axes of symmetry.

FIG. 7 illustrates the footprint 308" on bond pad 102 of a ball bond according to an embodiment of the present disclosure. In some embodiments, footprint 308" is non-circular and has a width a and a length b where b is greater than a. Accordingly, in some embodiments, the area of footprint 308" may be greater than the area of a circle having a diameter of a. In some embodiments, length b represents the longest dimension of footprint 308". In some embodiments, the ratio of b:a is equal to or greater than 1.1. In some embodiments, the ratio of b:a is equal to or greater than 1.2. In some embodiments, the ratio of b:a is equal to or greater than 1.3. In some embodiments, the ratio of b:a is equal to or greater than 1.4. In some embodiments, the ratio of b:a is equal to or greater than 1.5. In some embodiments, the ratio of b:a is equal to or greater than 1.6. In some embodiments, the ratio of b:a is equal to or greater than 1.7. In some embodiments, the ratio of b:a is equal to or greater than 1.8. In some embodiments, the ratio of b:a is equal to or greater than 1.9. In some embodiments, the ratio of b:a is equal to or greater than 2.0. In some embodiments, the ratio of b:a is equal to or greater than 2.1. In some embodiments, the ratio of b:a is equal to or greater than 2.2. In some embodiments, the ratio of b:a is equal to or greater than 2.3. In some embodiments, the ratio of b:a is equal to or greater than 2.4. In some embodiments, the ratio of b:a is equal to or greater than 2.5. In some embodiments, the ratio of b:a ranges from 1.1 to 1.5. In some embodiments, the ratio of b:a ranges from 1.2 to 1.6. In some embodiments, the ratio of b:a ranges from 1.3 to 1.7. In some embodiments, the ratio of b:a ranges from 1.4 to 1.8. In some embodiments, the ratio of b:a ranges from 1.5 to 1.9. In some embodiments, the ratio of b:a ranges from 1.6 to 2.0. In some embodiments, the ratio of b:a ranges from 1.7 to 2.1. In some embodiments, the ratio of b:a ranges from 1.8 to 2.2. In some embodiments, the ratio of b:a ranges from 1.9 to 2.3. In some embodiments, the ratio of b:a ranges from 2.0 to 2.4. In some embodiments, the ratio of b:a ranges from 2.1 to 2.5. In some embodiments, the ratio of b:a is less than 3.0. In some embodiments, the ratio of b:a is less than 4.0. In some embodiments, width a and length b are selected such that the ratio of b:a is equal to the ratio of L:W of bond pad 102. In some embodiments, width a and length b are selected such that the ratio of b:a is equal to the ratio of L:W of bond pad 102±1%. In some embodiments, width a and length b are selected such that the ratio of b:a is equal to the ratio of L:W of bond pad 102±5%. In some embodiments, width a and length b are selected such that the ratio of b:a is equal to the ratio of L:W of bond pad 102±10%. For instance, when used on a bond pad 102 having a width W of 40 µm and a length L of 80 µm, footprint 308" may have width a of about 25 µm to about 30 µm (e.g., 28 µm) and a length b of about 50 µm to about 60 µm (e.g., 56 µm), according to some non-limiting examples. In some embodiments, width a may be as small as about 23 µm. In some embodiments, width a and length b are selected based on the length L and width W of bond pad 102. In some embodiments, width a is less than or equal to width W minus a predetermined amount and length b is less than or equal to length L minus the same or a different predetermined amount. The predetermined amounts may be, for example, a particular tolerance level or desired clearance away from an edge of bond pad 102. In some such embodiments, the predetermined amounts may be, for example, at least 1 µm, at least 2 µm, at least 3 µm, at least 4 µm, at least 5 µm, at least 6 µm, at least 7 µm, at least 8 µm, at least 9 µm, at least 10 µm, at least 11 µm, or at least 12 µm. In some embodiments, the predetermined amount may range from 2 µm to 12 µm. Ball bonds according to some embodiments of the present disclosure may be used on bond pads, for example, having a width W as small as 30 µm and a length L as small as 33 µm.

In some embodiments, footprint 308" may have reflectional symmetry about a first axis A1. In some embodiments, length b is the largest dimension of footprint 308" measured along first axis A1 or along a parallel axis. In further embodiments, footprint 308" may also have reflectional symmetry about a second axis A2. In some embodiments, second axis A2 is perpendicular to first axis A1. In some embodiments, width a is the largest dimension of footprint 308" measured along second axis A2 or along a parallel axis. In some embodiments, footprint 308" has reflectional symmetry only about first axis A1 and/or second axis A2.

As shown in the illustrated example, footprint 308" in some embodiments may have a stadium shape. Generally, a stadium shape is composed of a rectangle with semicircles at a pair of opposite sides. In some such embodiments, footprint 308" has an area A that may be calculated by the following equation:

$$A = \pi(a/2)^2 + ab$$

It should be noted, however, that footprint 308" need not be limited to a stadium shape and that other geometries encompassed by the embodiments described herein may also be used according to the present disclosure. As will be described further, footprint 308" may have an oval or elliptical shape, rectangular shape, or rhombus shape according to additional embodiments. Other possible geometries for footprint 308" include, for example, triangular shapes, trapezoidal shapes, kite shapes, egg shapes, or the like. In some embodiments, footprint 308" may include one or more straight portions, and one or more curved portions. In some embodiments, footprint 308" has a shape that is a rounded polygon (e.g., polygon with rounded corners). As discussed, footprint 308" may have a geometry that includes at least one or only one axis of symmetry. In some embodiments, footprint 308" may have a geometry that includes at most two or only two axes of symmetry.

Figures 8A, 8B, 8C:
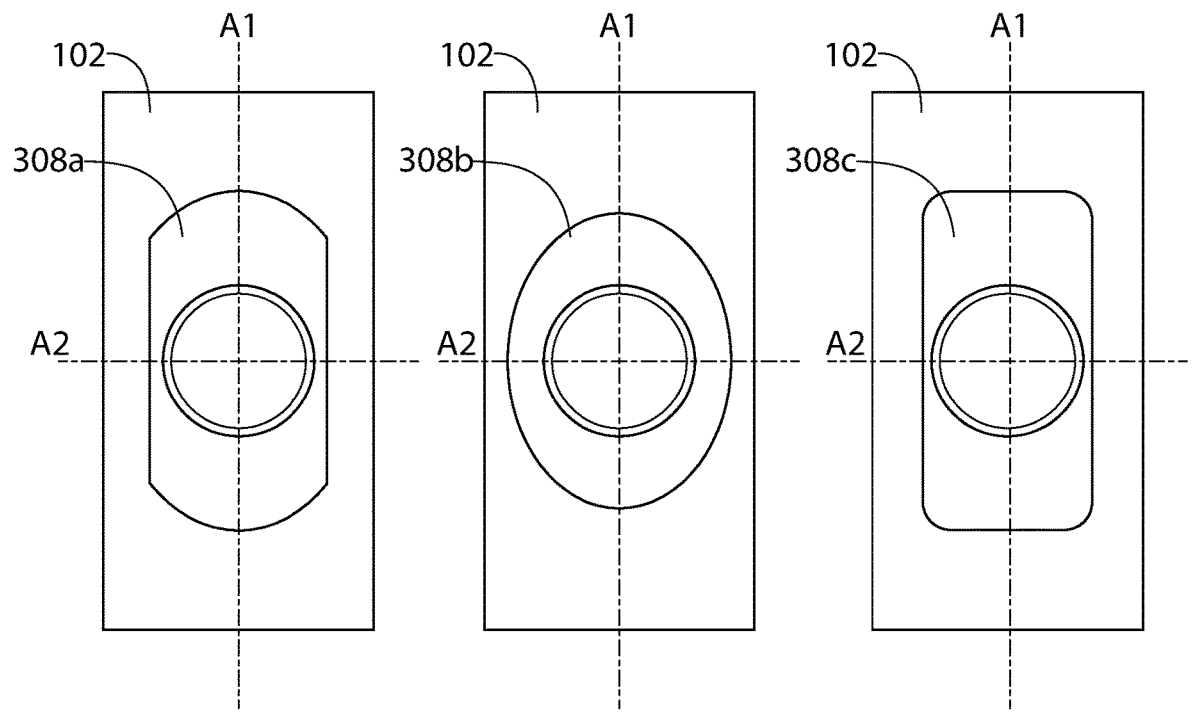
FIGS. 8A-8C are illustrations showing ball bonds having different shapes in accordance with various embodiments of the present disclosure.
Figure 8D:
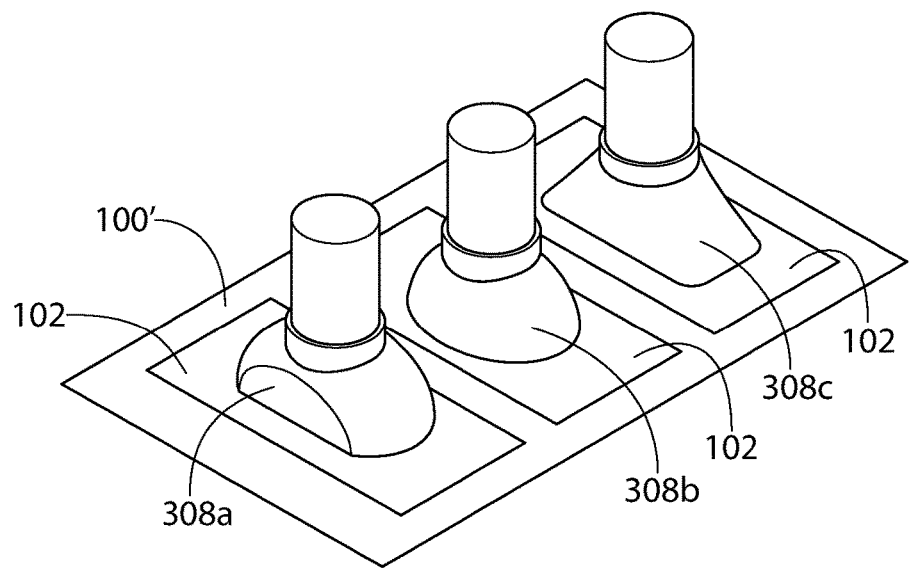
FIG. 8D is an illustration showing a perspective view of the ball bonds shown in FIGS. 8A-8C.

FIGS. 8A-8D provide illustrations showing ball bonds 308a, 308b, and 308c having different example geometries in accordance with various embodiments of the present disclosure. More particularly, FIGS. 8A-8C provide plan views of ball bonds 308a, 308b, and 308c, respectively, positioned on bond pads 102. FIG. 8D provides a partial perspective view of ball bonds 308a, 308b, and 308c positioned on bond pads 102 of a semiconductor device 100' (e.g., IC die) according to an embodiment of the present disclosure. In some embodiments, ball bond 308a may be shaped to have a stadium-shaped footprint (e.g., footprint 308" of FIG. 7). In some embodiments, ball bond 308b may be shaped to have an oval or elliptical footprint. In some embodiments, ball bond 308c may be shaped to have a rectangular or rounded rectangular footprint. In some embodiments, ball bonds 308a, 308b, and 308c may be symmetrical about first axis A1. In some embodiments, ball bonds 308a, 308b, and 308c may further be symmetrical about second axis A2.

Figure 9:
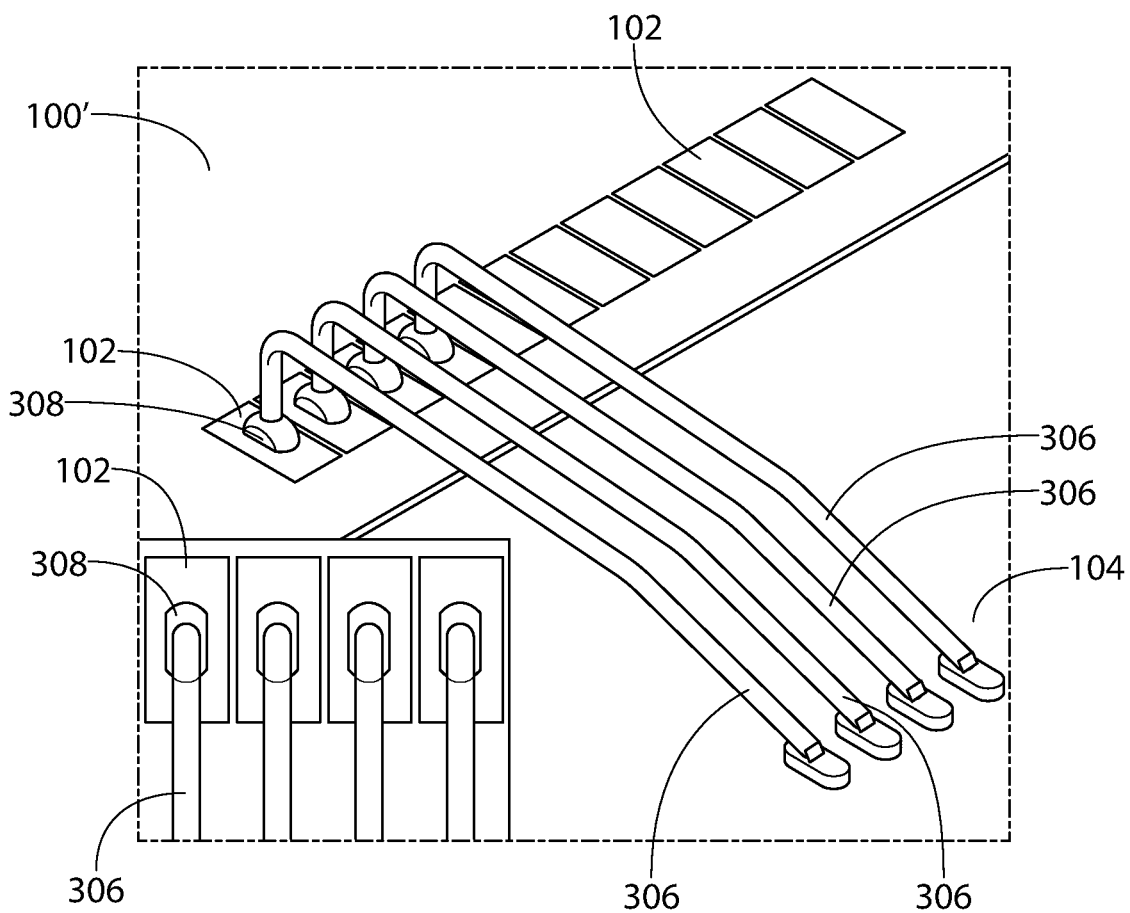
FIG. 9 is an illustration showing a portion of a semiconductor device with a plurality of bond pads and wires connected thereto with ball bonds according to an embodiment of the present disclosure.

FIG. 9 is an illustration showing a partial perspective view of semiconductor device 100' (e.g., IC die) in accordance with an embodiment of the present disclosure. Similar to semiconductor device 100, semiconductor device 100' includes a plurality of bond pads 102 that are configured to be connected to a packaging component 104, such as a lead frame or other physical structure for conducting electrical signals to/from semiconductor device 100'. Bond pads 102 are connected to packaging component 104 via a series of bond wires 306 that extend between bond pads 102 and packaging component 104. Bond pads 102 and bond wires 306 are formed from electrically conductive materials, usually a metal or metal alloy, for example, gold, copper, silver, aluminum, or alloys thereof. Bond pads 102 and bond wires 306 may be made from the same material or different materials. Each bond wire 306 may be connected to a separate bond pad 102. Typically each bond pad 102 will have a separate bond wire 306 connected thereto, but for clarity and ease of illustration FIG. 9 does not show every bond wire 306. Unlike semiconductor device 100, each bond wire 306 is physically connected (e.g., welded) to its respective bond pads 102 via a ball bond 308 that is shaped and configured to have a non-circular footprint (e.g., footprint 308") as discussed in the embodiments above. Ball bonds 308 may each be similarly shaped as illustrated, according to some embodiments. In other embodiments, ball bonds 308 may include ball bonds of different shapes (e.g., as shown in FIGS. 8A-8D). For example, ball bonds 308 may each be configured to have a stadium-shaped footprint (e.g., ball bond 308a), oval or elliptical footprint (e.g., ball bond 308b), or a rectangular or rounded rectangle footprint (e.g., ball bond 308c).

Figure 10A:
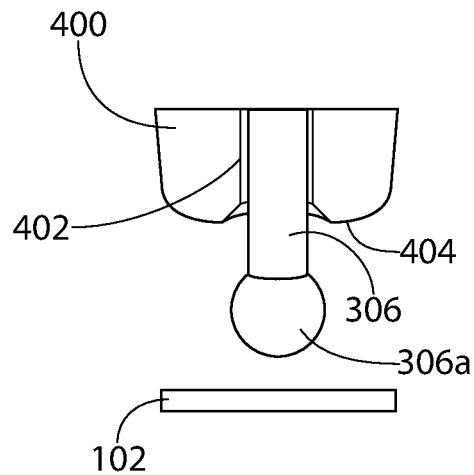
FIGS. 10A-10D illustrate steps of a wire bonding process according to an embodiment of the present disclosure used to form a ball bond on a bond pad.
Figure 10B:
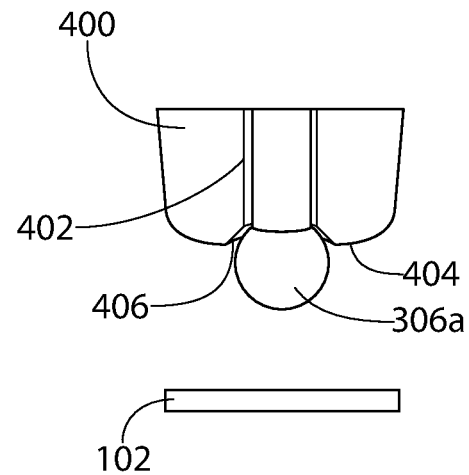
Figure 10C:
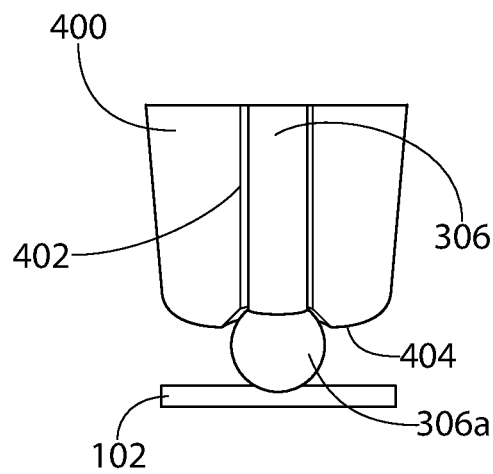

FIGS. 10A-10D provide cutaway views illustrating steps of a process for forming ball bond 308 from a bond wire 306 using a capillary 400 according to certain embodiments of the present disclosure. Capillary 400, in some embodiments, includes a body having a bore 402 and a tip 404 with a non-circular distal opening 406. In FIG. 10A, bond wire 306 has been fed through bore 402 of capillary 400 and is positioned above a bond pad 102. An end of bond wire 306 that extends past the tip 404 of capillary 400 is melted, for example, by a high-voltage electric charge or an EFO mechanism. Due to surface tension, the melted end of bond wire 306 beads up into a ball 306a, sometimes referred to as a "free air ball" or FAB. Ball 306a may have a diameter greater than the diameter of bond wire 306 or bore 402. In FIG. 10B, ball 306a is drawn toward tip 404 of capillary 400 (e.g., by an air tensioner) and is positioned within a distal opening 406 at tip 404 of capillary 400. Distal opening 406 is connected to bore 402 and defines a cavity that is particularly shaped to impart the desired geometry and size to ball bond 308. In FIG. 10C, capillary 400 and ball 306a are moved together toward bond pad 102 such that ball 306a makes physical contact with a surface of bond pad 102. For example, capillary 400 and ball 306a may be moved at a constant speed of about 0.6 mils/ms (about 0.01524 mm/ms).

Figure 10D:
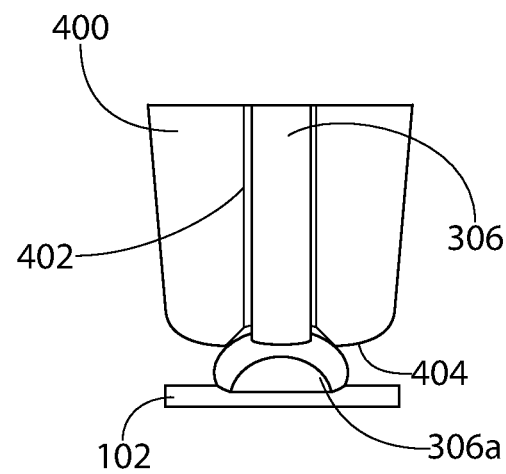
Figure 11A:
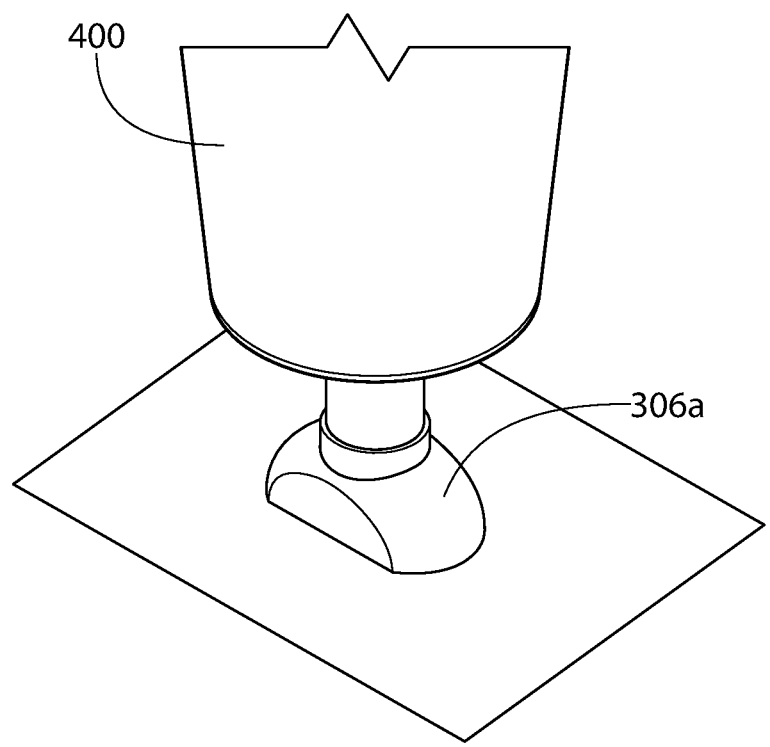
FIG. 11A is a perspective view of a capillary and a ball bond on a bond pad according to an embodiment of the present disclosure.
Figure 11B:
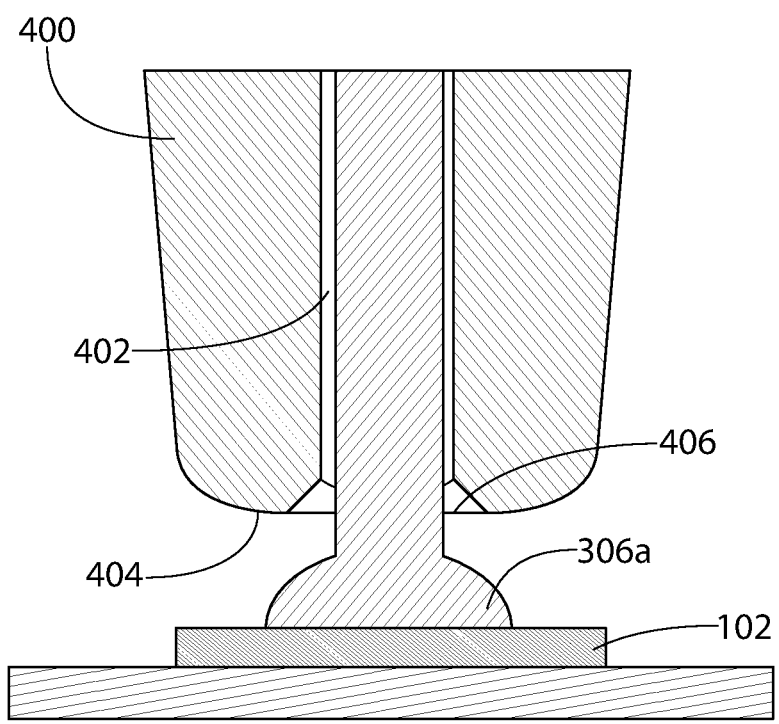
FIG. 11B is a cross-sectional view of the capillary and ball bond shown in FIG. 11A.

In FIG. 10D, tip 404 of capillary 400 continues to press ball 306a against the surface of bond pad 102. Unlike capillary 200 in the process shown in FIG. 2D that is configured to flatten ball 106a against bond pad 102, distal opening 406 of capillary 400 is sized and shaped to mold ball 306a into the desired geometry such that ball 306a forms a particular footprint shape on bond pad 102 (e.g., footprint 308"). Furthermore, unlike capillary 200, capillary 400 does not include a circular distal opening so therefore tip 404 is not a solid of revolution according to certain embodiments. In some embodiments, distal opening 406 defines a cavity in tip 404 that has a volume sufficient to contain all of or at least the majority of ball 306a. Ball 306a may then be welded to bond pad 102 using heat and/or ultrasonic energy to form ball bond 308. FIG. 11A is a perspective view of capillary 400 and ball 306a on bond pad 102 according to an embodiment of the present disclosure. FIG. 11B is a cross-sectional view of capillary 400 and ball 306a shown in FIG. 11A.

Figure 12A:
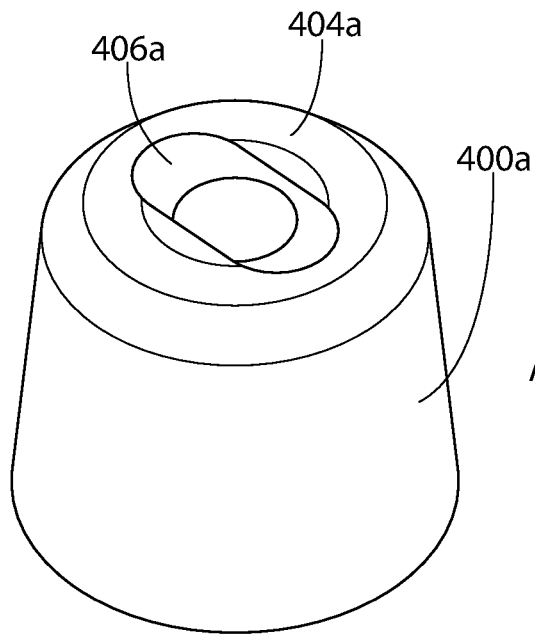
FIGS. 12A-12D show views of a capillary that is configured to produce a ball bond having a stadium shape according to an embodiment of the present disclosure.
Figure 12B:
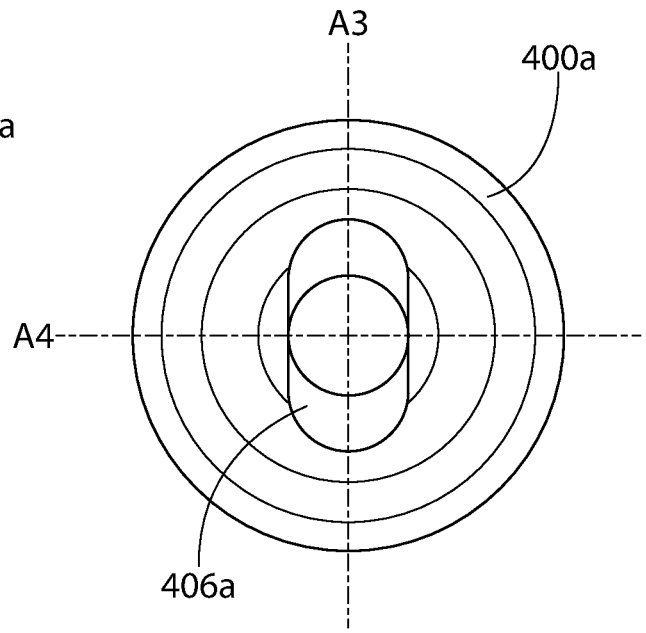
Figure 12C:
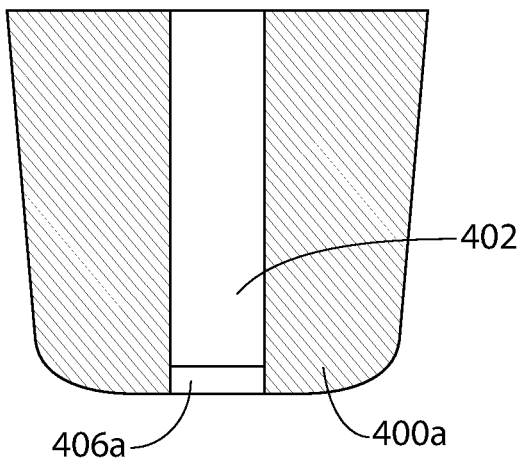
Figure 12D:
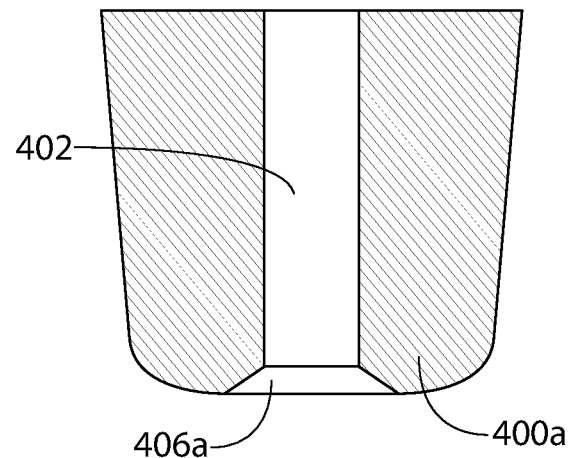
Figure 14A:
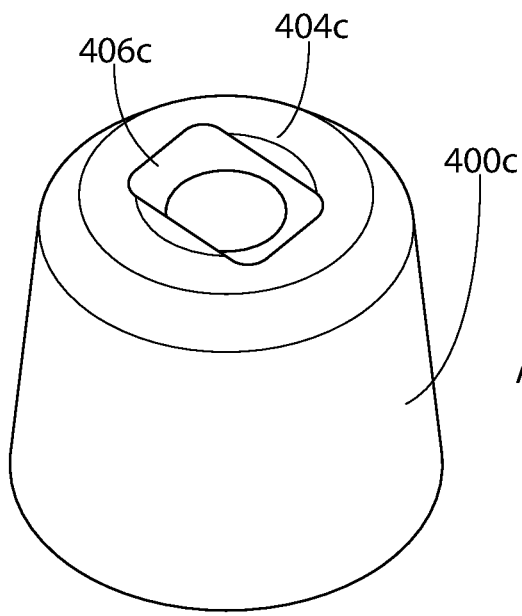
FIGS. 14A-14D show views of a capillary that is configured to produce a ball bond having a rounded rectangle shape according to an embodiment of the present disclosure.
Figure 14B:
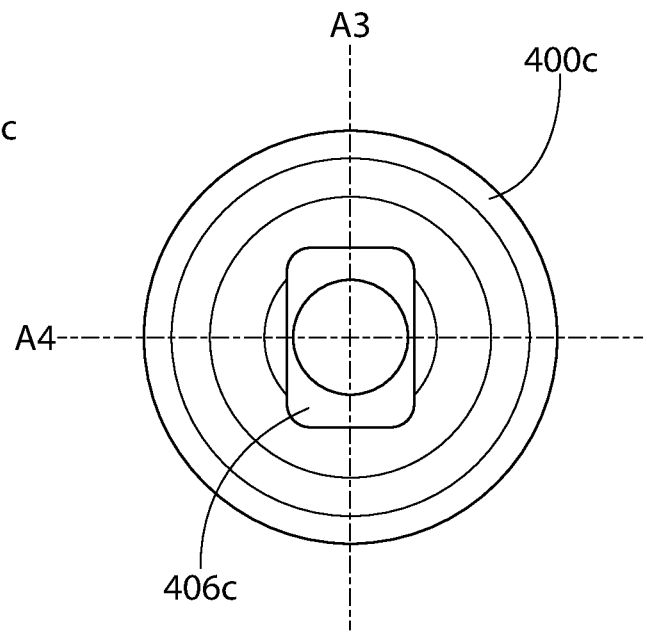
Figure 14C:
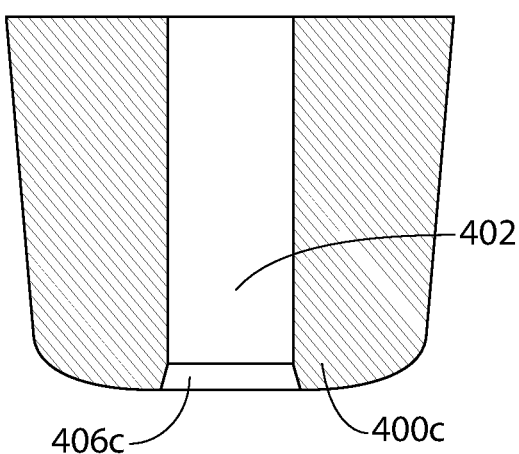
Figure 14D:
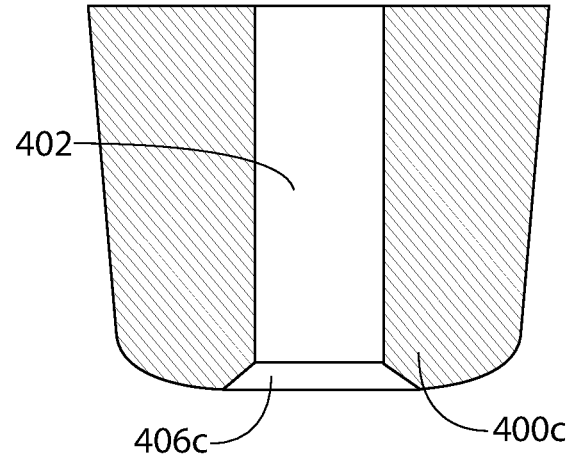
Figure 15A:
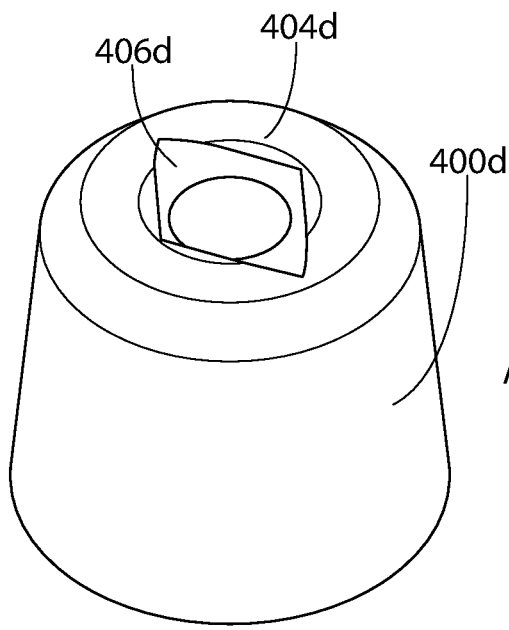
FIGS. 15A-15D show views of a capillary that is configured to produce a ball bond having a rhombus shape according to an embodiment of the present disclosure.
Figure 15B:
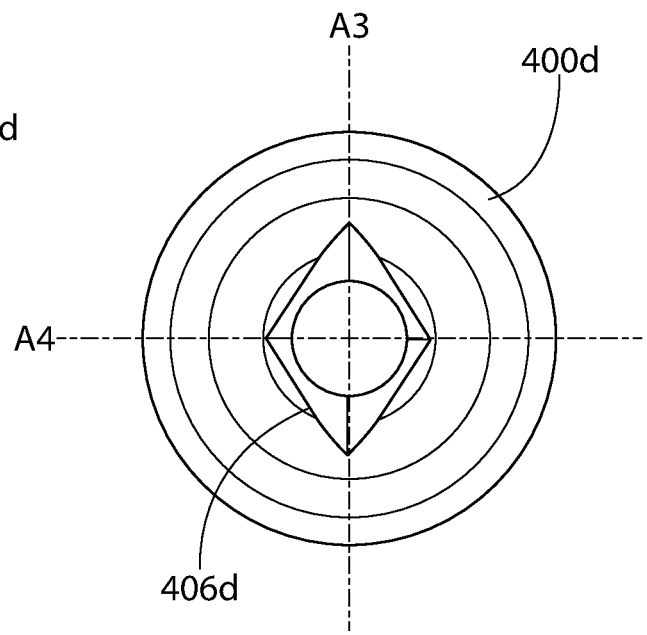
Figure 15C:
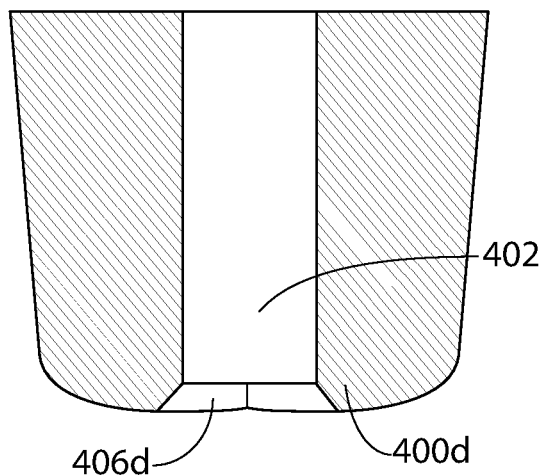
Figure 15D:
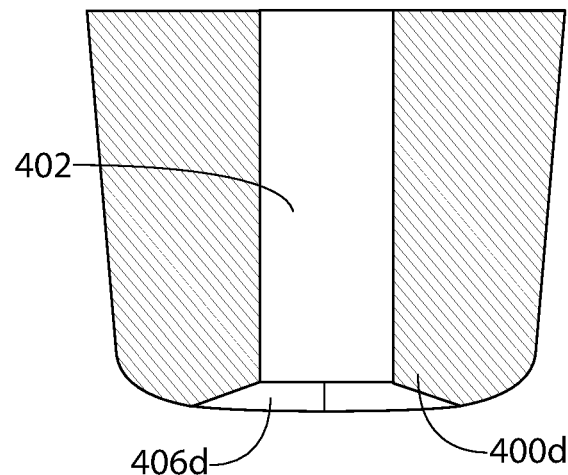

FIGS. 12A-15D show example capillaries having specific distal opening geometries that are configured to produce ball bonds according to embodiments of the present disclosure. The distal opening geometries may be formed, for example, by grinding or machining the tips of the capillaries to the desired shaped (e.g., CNC machining). In some embodiments, capillaries of the present disclosure may be formed by methods such as, for example, additive manufacturing (3D-printing) or molding. In some embodiments, the capillaries may be constructed from a ceramic material, for example, aluminum oxides, or other materials used in the art for conventional capillaries. FIGS. 12A-12D are illustrations showing views of a capillary 400a according to one embodiment that is configured to form a ball bond having a stadium-shaped footprint, for example, ball bond 308a of FIGS. 8A, 8D. Capillary 400a includes a hollow body having a bore 402 and a tip 404a with a stadium-shaped distal opening 406a. FIGS. 12A and 12B provide, respectively, a perspective view and a plan view of capillary 400a showing tip 404a and stadium-shaped distal opening 406a. FIGS. 12C and 12D provide cross-sectional views of capillary 400a taken along planes designated by axes A4 and A3 of FIG. 12B, respectively. FIGS. 13A-13D are illustrations showing views of a capillary 400b according to one embodiment that is configured to form a ball bond having an oval or elliptical footprint, for example, ball bond 308b of FIGS. 8B, 8D. Capillary 400b includes a hollow body having a bore 402 and a tip 404b with a oval or elliptical distal opening 406b. FIGS. 13A and 13B provide, respectively, a perspective view and a plan view of capillary 400b showing tip 404b and oval or elliptical distal opening 406b. FIGS. 13C and 13D provide cross-sectional views of capillary 400b taken along planes designated by axes A4 and A3 of FIG. 13B, respectively. FIGS. 14A-14D are illustrations showing views of a capillary 400c according to one embodiment that is configured to form a ball bond having a rectangular or rounded rectangular footprint, for example, ball bond 308c of FIGS. 8C, 8D. Capillary 400c includes a hollow body having a bore 402 and a tip 404c with a rounded rectangular distal opening 406c. FIGS. 14A and 14B provide, respectively, a perspective view and a plan view of capillary 400c showing tip 404c and rounded rectangular opening 406c. FIGS. 14C and 14D provide cross-sectional views of capillary 400c taken along planes designated by axes A4 and A3 of FIG. 14B, respectively. FIGS. 15A-15D are illustrations showing views of a capillary 400d according to one embodiment that is configured to form a ball bond having a rhombus-shaped footprint. Capillary 400d includes a hollow body having a bore 402 and a tip 404d with a rhombus-shaped distal opening 406d. FIGS. 15A and 15B provide, respectively, a perspective view and a plan view of capillary 400d showing tip 404d and rhombus-shaped opening 406d. FIGS. 15C and 15D provide cross-sectional views of capillary 400d taken along planes designated by axes A4 and A3 of FIG. 15B, respectively.

One or more of the components described herein may form a system for forming a ball bond, according to some embodiments of the present disclosure. For example, a system for forming a ball bond may include one or more of the capillaries (e.g., capillaries 400a-400d) described herein. In some embodiments, the system may further include one or more bond wires (e.g., bond wire 306) that are configured to be received by the capillaries. The system may further include semiconductor device 100' and bond pads 102. In some embodiments, the system may also include tools and apparatuses (not shown), for example, an EFO mechanism for melting the bond wire and forming the FAB, and/or an ultrasonic transducer for welding the FAB to the bond pad.

It should be understood that various changes, substitutions, and alterations can be made herein without departing from the spirit and scope of the disclosure as defined by the appended claims. It should also be apparent that individual elements identified herein as belonging to a particular embodiment may be included in other embodiments of the disclosure. Moreover, the scope of the present application is not intended to be limited to the particular embodiments of the process, machine, manufacture, and composition of matter, means, methods and steps described in the specification. The scope of the disclosure also is not meant to be limited by the title or the abstract, as these parts of the application are provided to facilitate searching specific features disclosed herein. As one of ordinary skill in the art will readily appreciate from the disclosure, processes, machines, manufacture, composition of matter, means, methods, or steps, presently existing or later to be developed, that perform substantially the same function or achieve substantially the same result as the corresponding embodiments described herein may be used according to the present disclosure.

What is claimed is:

1. A semiconductor device comprising:
   an integrated circuit die having a plurality of bond pads; and
   a plurality of bond wires, each of the plurality of bond wires being physically connected to a respective one of the plurality of bond pads by a ball bond,
   wherein a footprint of each ball bond in an area of contact between each ball bond and the respective bond pad has a shape that is non-circular and includes a first axis of symmetry,
   wherein the footprint of each ball bond includes a ball bond width and a ball bond length, and
   wherein each of the bond pads includes a bond pad width and a bond pad length, and wherein a ratio of the ball bond length to the ball bond width is equal to a ratio of the bond pad length to the bond pad width ±10%.

2. The semiconductor device of claim 1, wherein the shape of the footprint of each ball bond in the area of contact includes a second axis of symmetry, wherein the second axis of symmetry is perpendicular to the first axis of symmetry.

3. The semiconductor device of claim 2, wherein the shape of the footprint of each ball bond in the area of contact includes no more than two axes of symmetry.

4. The semiconductor device of claim 1, wherein a ratio of the ball bond length to the ball bond width is greater than 1.1.

5. The semiconductor device of claim 4, wherein the ratio of the ball bond length to the ball bond width is equal to or greater than 2.0.

6. The semiconductor device of claim 4, wherein the ball bond length is the largest dimension of the shape of the footprint of each ball bond at the area of contact along the first axis of symmetry.

7. The semiconductor device of claim 1, wherein the ratio of the ball bond length to the ball bond width is equal to the ratio of the bond pad length to the bond pad width ±5%.

8. The semiconductor device of claim 7, wherein the ratio of the ball bond length to the ball bond width is equal to the ratio of the bond pad length to the bond pad width.

9. The semiconductor device of claim 4, wherein the footprint of each ball bond in the area of contact is greater than an area of a circle with a diameter equal to the ball bond width.

10. The semiconductor device of claim 1, wherein the shape of the footprint of each ball bond in the area of contact is selected from the group consisting of a stadium shape, an oval, an ellipse, a rectangle, a rounded rectangle, and a rhombus.

11. The semiconductor device of claim 1, wherein the shape of the footprint of each ball bond in the area of contact includes only two axes of symmetry.

* * * * *